United States Patent
McElfresh et al.

(10) Patent No.: US 8,140,277 B2
(45) Date of Patent: Mar. 20, 2012

(54) ENHANCED CHARACTERIZATION OF ELECTRICAL CONNECTION DEGRADATION

(75) Inventors: David K. McElfresh, San Diego, CA (US); Kenny C. Gross, San Diego, CA (US); Leoncio D. Lopez, Escondido, CA (US); Dan Vacar, San Diego, CA (US)

(73) Assignee: Oracle America, Inc., Redwood Shores, CA (US)

( * ) Notice: Subject to any disclaimer, the term of this patent is extended or adjusted under 35 U.S.C. 154(b) by 423 days.

(21) Appl. No.: 12/415,814

(22) Filed: Mar. 31, 2009

(65) Prior Publication Data
US 2010/0250158 A1    Sep. 30, 2010

(51) Int. Cl.
*G01R 31/00* (2006.01)
*G06F 17/18* (2006.01)
*G06F 19/00* (2006.01)

(52) U.S. Cl. ........ 702/58; 324/750.3; 702/179; 702/184

(58) Field of Classification Search ............... 702/57, 702/58, 81, 159, 183, 184, 185, 179; 324/538, 324/750.3; 399/9; 714/726, 736
See application file for complete search history.

(56) References Cited

U.S. PATENT DOCUMENTS

| | | | |
|---|---|---|---|
| 6,519,421 B2 * | 2/2003 | Inoue | 399/9 |
| 6,617,869 B1 * | 9/2003 | Pillkahn | 324/750.3 |

* cited by examiner

*Primary Examiner* — John H Le
(74) *Attorney, Agent, or Firm* — Park, Vaughan, Fleming & Dowler LLP

(57) ABSTRACT

One embodiment provides a system that analyzes an electrical connection in a computer system. During operation, the system monitors a reflection coefficient associated with the electrical connection and applies a sequential-analysis technique to the reflection coefficient to determine a statistical deviation of the reflection coefficient. Next, the system assesses the integrity of the electrical connection based on the statistical deviation of the reflection coefficient. Finally, the system uses the assessed integrity to maintain the electrical connection.

17 Claims, 2 Drawing Sheets

ENHANCED CHARACTERIZATION OF ELECTRICAL CONNECTION DEGRADATION

BACKGROUND

1. Field

The present embodiments relate to techniques for analyzing degradation in electrical connections. More specifically, the present embodiments relate to a method and system for detecting the onset of degradation in electrical connections through sequential analysis of time domain reflectometry reflection coefficients.

2. Related Art

Issues with the integrity of electrical connectors are a leading source of errors and failures in computer systems. Such integrity issues may also cause intermittent faults that result in costly No Trouble Found (NTF) events in the computer systems. To mitigate the impact of such errors, failures, and faults, time domain reflectometry (TDR) may be used to characterize the integrity of electrical conduction pathways, especially at high frequencies. Using TDR, integrity issues in a conductor may be detected by measuring the reflection coefficient of a rise time pulse transmitted along the conductor. The reflection coefficient may then be used to diagnose faults in the conductor.

Current applications of TDR are limited to diagnosing existing problems in electrical connectors. For example, TDR may be used in root-cause analysis of existing problems such as short or open circuits. Moreover, predictive approaches to analyzing conduction pathway degradation using TDR are currently unknown. As a result, conventional uses of TDR may preclude the detection of degradation in electrical connectors prior to the occurrence of faults in the electrical connectors caused by the degradation. The lack of early detection may further inhibit a thorough understanding of degradation modes in electrical connectors.

Hence, what is needed is a technique for analyzing and characterizing the degradation of electrical connectors without the limitations described above.

SUMMARY

One embodiment provides a system that analyzes an electrical connection in a computer system. During operation, the system monitors a reflection coefficient associated with the electrical connection and applies a sequential-analysis technique to the reflection coefficient to determine a statistical deviation of the reflection coefficient. Next, the system assesses the integrity of the electrical connection based on the statistical deviation of the reflection coefficient. Finally, the system uses the assessed integrity to maintain the electrical connection.

In some embodiments, assessing the integrity of the electrical connection involves verifying the integrity of the electrical connection if the statistical deviation is not found in the reflection coefficient and identifying a degradation risk associated with the electrical connection if the statistical deviation is found in the reflection coefficient.

In some embodiments, the sequential-analysis technique corresponds to a sequential probability ratio test.

In some embodiments, monitoring the reflection coefficient involves periodically measuring the reflection coefficient from the electrical connection using time domain reflectometry (TDR) and digitizing the reflection coefficient.

In some embodiments, the sequential-analysis technique determines the statistical deviation of the reflection coefficient by comparing the reflection coefficient with previous reflection coefficients measured from the electrical connection.

In some embodiments, the sequential-analysis technique is applied to the reflection coefficient using a service processor in the computer system.

In some embodiments, using the assessed integrity to maintain the electrical connection involves at least one of performing advanced reliability testing on the electrical connection and correcting a fault in the electrical connection corresponding to a source of the statistical deviation.

BRIEF DESCRIPTION OF THE FIGURES

In the figures, like reference numerals refer to the same figure elements.

DETAILED DESCRIPTION

Figure 1:
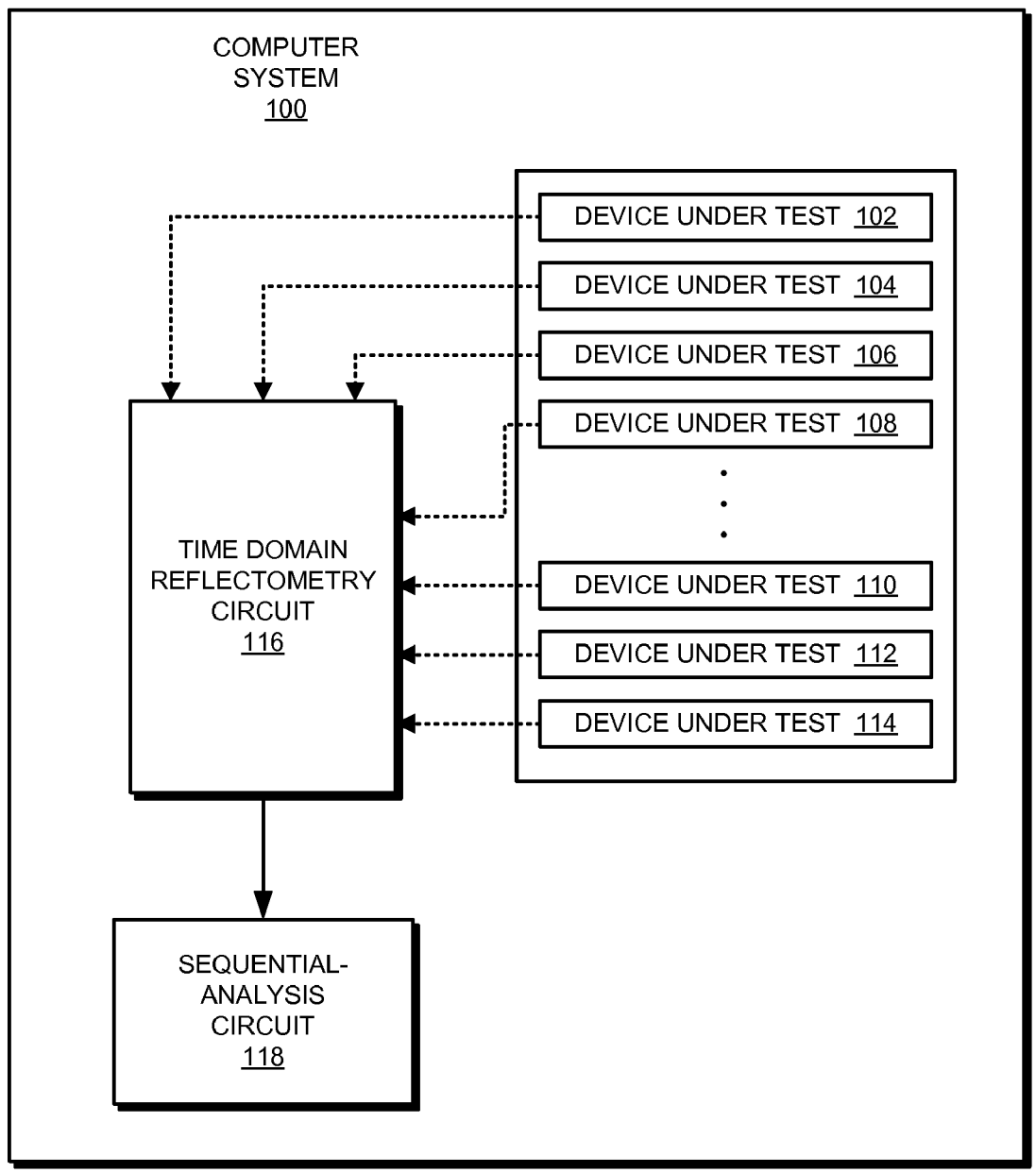
FIG. 1 shows a computer system in accordance with an embodiment.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Embodiments provide a method and system for analyzing an electrical connection. The electrical connection may be formed using one or more wires, cables, conductive traces, solder joints, component and device connectors, and/or other conductive devices and materials. The electrical connection may additionally be found in a computer system, such as a personal computer, laptop computer, server, workstation, and/or other electronic computing device.

More specifically, embodiments provide a method and system for assessing the integrity of the electrical connection using time domain reflectometry (TDR) and sequential analysis. A reflection coefficient for the electrical connection may be periodically monitored using TDR. Next, the reflection coefficient may be analyzed using a sequential-analysis technique (e.g., sequential probability ratio test (SPRT)) to determine a statistical deviation of the reflection coefficient. The integrity of the electrical connection may then be assessed based on the statistical deviation. If no statistical deviation is found, the integrity of the electrical connection is verified. If a statistical deviation is found, a degradation risk associated with the electrical connection may be identified. As a result, embodiments may enable early detection of degradation in the electrical connection prior to the occurrence of failures in the electrical connection.

Such early detection may allow the degradation of the electrical connection to be characterized and may further allow the electrical connection to be maintained. In particular, the periodically assessed integrity may enable advanced reliability testing on the electrical connection. The assessed integrity may also be used to correct a fault in the electrical connection corresponding to the source of the statistical deviation found using the sequential-analysis technique.

FIG. 1 shows a computer system 100 in accordance with an embodiment. Computer system 100 includes a number of devices under test 102-114, a time domain reflectometry (TDR) circuit 116, and a sequential-analysis circuit 118. Each of these components is described in further detail below.

Computer system 100 may correspond to an electronic computing device that provides one or more services or functions to a user. For example, computer system 100 may operate as a personal computer, laptop computer, server, and/or workstation. Furthermore, the functionality of computer system 100 may be provided by the execution of software on hardware components of computer system 100, such as processors, memory, input/output (I/O) devices, and/or network interface cards. For example, computer system 100 may include an operating system that coordinates the use of hardware and software resources on computer system 100, as well as one or more applications that perform specialized tasks for the user.

Those skilled in the art will appreciate that the functionality of computer system 100 may be based on the integrity of electrical connections within computer system 100. Such electrical connections may be formed using wires, cables, conductive traces, solder joints, component and device connectors, and/or other conductive devices and materials. Moreover, the electrical connections may allow electrical signals to be transmitted between various hardware devices (e.g., devices under test 102-114) and/or components in computer system 100. For example, reliable electrical connections may be required to enable various chips, storage devices, I/O devices, and/or other hardware components in computer system 100 to function properly and communicate with one another. As a result, degradation in any of the electrical connections may cause errors, failures, and/or faults in computer system 100, including No Trouble Found (NTF) events.

To mitigate issues related to faulty electrical connections, TDR circuit 116 may be used to monitor the integrity of electrical connections between devices and components in computer system 100. In particular, TDR circuit 116 may periodically measure a reflection coefficient from a device under test (e.g., devices under test 102-114) using TDR. In other words, TDR circuit 116 may transmit a pulsed signal into the device under test and measure the reflection of the signal (e.g., the reflection coefficient) from the device under test. A step change in the reflection coefficient may correspond to a fault in an electrical connection associated with the device under test. Furthermore, the location of the fault may be determined by examining the delay between the transmission of the signal and the step change in the reflection coefficient as the signal is transmitted through the electrical connection and reflected at the fault.

In one or more embodiments, TDR circuit 116 measures reflection coefficients from one or more devices under test 102-114 while computer system 100 is operational. Furthermore, the reflection coefficients measurements may be scheduled to occur in an idle state of computer system 100. For example, computer system 100 may correspond to a server in a data center. The server may execute workload transactions a portion of the time (e.g., 20% of the time) and revert to an idle state when not executing workload transactions (e.g., 80% of the time). As a result, TDR circuit 116 may operate as a background process that executes during an idle state of computer system 100 to prevent the operation of TDR circuit 116 from interfering with the execution of other processes on computer system 100, such as server workload transactions. In other words, TDR circuit 116 may enable integrity checks to be performed on electrical connections within computer system 100 without interfering with the functionality of and/or disassembling computer system 100, unlike conventional techniques that require disassembly of computers to perform optical or X-ray integrity analysis of electrical connections within the computers.

The reflection coefficients may be used by computing system 100 to predictively analyze faults in electrical connections within devices under test 102-114. The predictive analysis may allow degradation in the electrical connections to be detected prior to the development of faults in the electrical connections caused by the degradation. In addition, the early detection of degradation in the electrical connections may allow various degradation modes in the electrical connections to be characterized (e.g., in advanced reliability testing) and/or faults in the electrical connections to be corrected.

In one or more embodiments, TDR circuit 116 corresponds to a digital signal processor (DSP) in computer system 100. Consequently, TDR circuit 116 may include functionality to digitize the reflection coefficients obtained from performing TDR on a variety of devices under test 102-114. The digitized reflection coefficients may then be sent to sequential-analysis circuit 118, which may assess the integrity of the electrical connections using the digitized reflection coefficients.

After obtaining the digitized reflection coefficients, sequential-analysis circuit 118 may apply a sequential-analysis technique to each of the reflection coefficients to determine a statistical deviation of the reflection coefficient. In other words, sequential-analysis circuit 118 may use sequential analysis to compare the most recent reflection coefficient for an electrical connection with previous reflection coefficients measured from the electrical connection to determine if a statistical deviation exists in the most recent reflection coefficient. As discussed in further detail below, the integrity of the electrical connection may then be assessed based on the presence or absence of the statistical deviation of the reflection coefficient.

In one or more embodiments, the sequential-analysis technique used by sequential-analysis circuit 118 corresponds to a sequential probability ratio test (SPRT). To apply the SPRT to the reflection coefficient, sequential-analysis circuit 118 may include, as hypotheses, a false-alarm probability and a missed-alarm probability, with an indifference region between the false-alarm probability and the missed-alarm probability. Both hypotheses may be configured based on historical reflection coefficients associated with devices under test 102-114 and/or similar devices. For example, the false-alarm probability and missed-alarm probability for reflection coefficients measured from a printed circuit board (PCB) may be based on previous reflection coefficients obtained from the PCB and/or identical PCBs in computer system 100 or other machines. Furthermore, one or both hypotheses may be used to adjust the sensitivity of sequential-analysis circuit 118 to false positives or false negatives in detecting degradation from the monitored electrical connections.

The determination of statistical deviations in the monitored reflection coefficients by sequential-analysis circuit 118 may also be based on previous reflection coefficients for the electrical connections. More specifically, sequential-analysis circuit 118 may use the SPRT to analyze the statistical deviation of newly measured reflection coefficients from TDR circuit 116 in light of previous reflection coefficients measured from the monitored electrical connections and/or similar electrical connections. For example, sequential-analysis circuit 118 may analyze a newly measured reflection coefficient for an electrical connection for statistical conformity to a probability distribution of previously measured reflection coefficients associated with the electrical connection. Sequential-analysis circuit 118 may then generate an alert if a newly measured reflection coefficient differs statistically from the previously measured reflection coefficients. For example, sequential-analysis circuit 118 may generate an alert if the newly measured reflection coefficient corresponds to a probability distribution with a higher or lower mean and/or larger or smaller levels of variability (e.g., spikiness, burstiness, thrashing, cycling, etc.) than the previously measured reflection coefficients.

The false-alarm probability used in the SPRT may correspond to the probability and/or frequency of false alarms in identifying statistical deviations in the reflection coefficients. For example, if the false-alarm probability is set to one in 1000 observations, an alert frequency of one in 1000 observations or fewer may indicate that the monitored electrical connection is functioning normally. In other words, the monitored electrical connection is not exhibiting signs of degradation if sequential-analysis circuit 118 generates an alert based on a detected statistical deviation as specified by the false-alarm probability (e.g., one in 1000 observations).

The absence or presence of the statistical deviation in the reflection coefficient may then be used to assess the integrity of the electrical connection. In particular, the integrity of the electrical connection may be verified if no statistical deviation is identified as signified by SPRT alarm flags. Conversely, a degradation risk associated with the electrical connection may be identified if a statistical deviation is found (e.g., if the alert frequency is above the missed-alarm probability). For example, a statistical deviation in the reflection coefficient may be caused by a partial-penetration solder joint crack that may later lead to a failure in the electrical connection.

The assessed integrity may be used to maintain the electrical connection. For example, the integrity of the electrical connection may continue to be verified until potential degradation is detected in the form of a statistical deviation in the electrical connection's reflection coefficient. Once a statistical deviation is established, advanced reliability testing may be performed on the electrical connection to further analyze the degradation process (e.g., precise failure times, failure signature characterization, etc.) in the electrical connection.

For example, the progression of degradation in the electrical connection may be tracked by monitoring the reflection coefficient and/or other attributes of the electrical connection until the degradation leads to one or more errors, failures, and/or faults.

The electrical connection may also be maintained by correcting a fault in the electrical connection corresponding to the source of the statistical deviation. For example, the source of the statistical deviation may be determined through continued monitoring and analysis of the electrical connection. A fault or potential fault in the electrical connection may then be corrected by replacing a conductive component (e.g., solder joint, wire, cable, conductive trace, etc.) associated with the source of the statistical deviation. Future faults may also be averted or minimized by making the appropriate repairs and improvements on devices and components affected by the degradation.

In one or more embodiments, sequential-analysis circuit 118 corresponds to a service processor in computer system 100. The inclusion of both TDR circuit 116 and sequential-analysis circuit 118 in computer system 100 may thus enable in-situ analysis of electrical connections within computer system 100. On the other hand, the functionality of TDR circuit 116 and/or sequential-analysis circuit 118 may be performed by a variety of components within computer system 100 or external to computer system 100. For example, TDR circuit 116 may be included in a peripheral device outside of computer system 100 that measures reflection coefficients from devices under test 102-114. Similarly, the functionality of sequential-analysis circuit 118 may be implemented by any processor (e.g., a central processing unit (CPU)) in computer system 100 or in another computer system. For example, reflection coefficients measured from a variety of computer systems may be sent over a network connection to a remote monitoring center that assesses the integrity of electrical connections from each computer system by comparing the reflection coefficients from the computer system with those of other computer systems and/or historical reflection coefficients.

Those skilled in the art will appreciate that conventional applications of TDR may involve performing a threshold-limit test on reflection coefficients instead of a sequential-analysis technique like SPRT. For example, the threshold-limit test may compare the reflection coefficients obtained from an electrical connection to a predetermined threshold. If the reflection coefficients remain within the threshold, the electrical connection is classified as functioning normally. However, if the reflection coefficients exceed the threshold, the electrical connection is classified as faulty.

Threshold-limit tests in TDR may include an inherent tradeoff between false alarms and sensitivity. For example, if the threshold is set too close to the nominal (e.g., mean) reflection coefficient for an electrical connection, false alarms may frequently occur from spurious reflection coefficients measured using TDR. On the other hand, if the threshold is set further from the mean, sensitivity to subtle degradation in the electrical connection may be lost.

The use of SPRT to analyze reflection coefficients by sequential-analysis circuit 118 may overcome the inherent disadvantages of threshold-limit tests by analyzing reflection coefficients from the electrical connection as a digitized times series signal. The SPRT may enable both false alarm avoidance and high sensitivity in detecting degradation by including user configurable false-alarm and missed-alarm probabilities, as described above. In addition, the SPRT may catch subtle anomalies in noise time series process variables (e.g., reflection coefficients) using the mathematically shortest decision time.

The use of SPRT in analyzing TDR reflection coefficients may thus provide proactive and/or prognostic capabilities in characterizing and/or maintaining electrical connections. For example, TDR circuit 116 and sequential-analysis circuit 118 may detect and characterize slight resistance and/or impedance changes due to corrosion, mechanical scratching caused by vibration, changes in contact pressure from thermal phenomena, and/or partial-penetration solder joints. Because conventional TDR applications do not employ sequential-analysis techniques such as SPRT, such conventional TDR applications may be unable to provide the proactive and/or prognostic capabilities of TDR circuit 116 and sequential-analysis circuit 118.

Consequently, TDR circuit 116 and sequential-analysis circuit 118 may extend the capabilities of TDR by enabling the detection of degradation in electrical connections prior to the occurrence of major faults caused by the degradation. The early detection of degradation may further enable finer-grained characterization of the degradation mode with time by increasing the sampling rate of TDR circuit 116 and/or other mechanisms used to monitor the electrical connections. In other words, TDR circuit 116 and sequential-analysis circuit 118 may enable prognostic information to be obtained from degrading electrical connections prior to the occurrence of failures in the electrical connections. In addition, advanced reliability testing and/or failure analysis conducted during the progression of degradation may allow for a more thorough understanding of the causes and effects of failures in the electrical connections. Finally, early detection and monitoring of degradation in the electrical connections may allow the degradation to be remedied before major faults occur.

Figure 2:
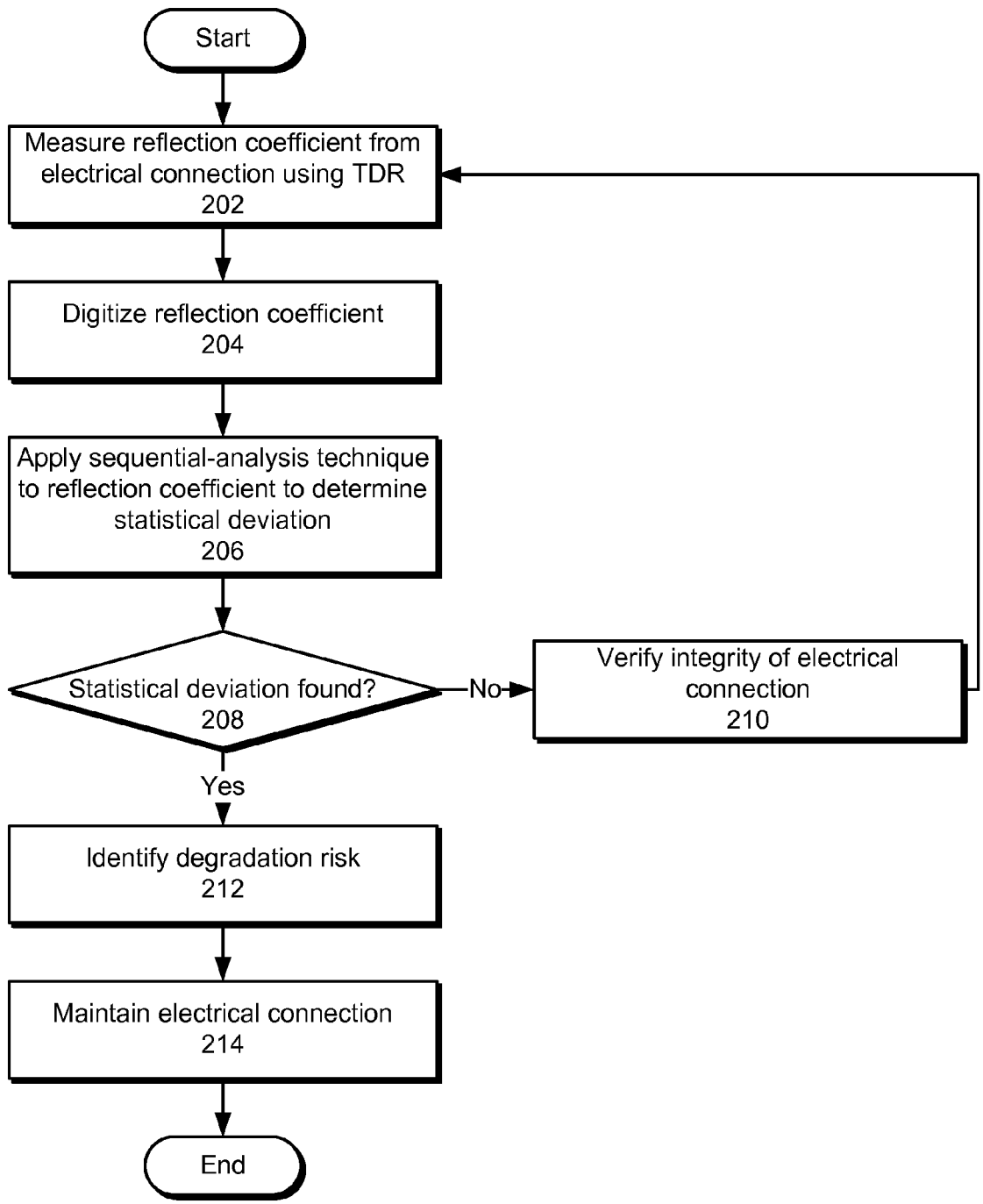
FIG. 2 shows a flowchart illustrating the process of analyzing an electrical connection in accordance with an embodiment.

FIG. 2 shows a flowchart illustrating the process of analyzing an electrical connection in a computer system in accordance with an embodiment. In one or more embodiments, one or more of the steps may be omitted, repeated, and/or performed in a different order. Accordingly, the specific arrangement of steps shown in FIG. 2 should not be construed as limiting the scope of the technique.

Initially, a reflection coefficient is measured from the electrical connection using TDR (operation 202). The electrical connection may be formed from a variety of conductive components and devices within a computer system, such as wires, cables, conductive traces, solder joints, and/or component and device connectors. The reflection coefficient may be obtained by transmitting a pulsed signal through the electrical connection and observing the reflection of the pulsed signal over time. The reflection coefficient may then be digitized (operation 204). In particular, a DSP in the computer system may be used to perform TDR on the electrical connection and digitize the reflection coefficient obtained from the TDR.

Next, a sequential-analysis technique may be applied to the reflection coefficient to determine a statistical deviation of the reflection coefficient (operation 206). As described above, the sequential-analysis technique may be applied to the reflection coefficient using a service processor in the computer system. Furthermore, the sequential-analysis technique may determine the statistical deviation of the reflection coefficient by comparing the reflection coefficient with previous reflection coefficients measured from the electrical connection (e.g., in time series analysis) and/or from identical electrical connections (e.g., from identical devices). For example, the sequential-analysis technique may correspond to SPRT.

The integrity of the electrical connection may then be assessed based on the presence or absence of the statistical deviation (operation 208). More specifically, if no statistical deviation is found in the reflection coefficient, the integrity of the electrical connection is verified (operation 210). As such, the reflection coefficient is continually measured (operation 202), digitized (operation 204) and analyzed for statistical deviation (operation 206) until a statistical deviation is observed using the sequential-analysis technique. In other words, the electrical connection is continually monitored for degradation by repeatedly measuring the reflection coefficient from the electrical connection and analyzing the reflection coefficient for statistical conformity using the sequential-analysis technique. For example, the integrity of the electrical connection may be verified by measuring and analyzing the reflection coefficient from the electrical connection once per second.

Once a statistical deviation is found, a degradation risk associated with the electrical connection is identified (operation 212). The degradation risk may represent the onset of degradation in one or more conductive components forming the electrical connection. The degradation risk may further be used to maintain the electrical connection (operation 214). For example, advanced reliability testing and/or failure analysis may be performed on the electrical connection to examine the degradation process in the electrical connection. The electrical connection may also be maintained by correcting one or more faults or potential faults corresponding to the sources (e.g., causes) of the statistical deviation. For example, one or more electrical components may be replaced, repaired, or improved to maintain the integrity of electrical connections formed by the electrical components and the continued functioning of the computer system.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A computer-implemented method for analyzing an electrical connection in a computer system, comprising:

monitoring a reflection coefficient associated with the electrical connection;

applying a sequential-analysis technique to the reflection coefficient to determine a statistical deviation of the reflection coefficient;

assessing the integrity of the electrical connection based on the statistical deviation of the reflection coefficient by verifying the integrity of the electrical connection if the statistical deviation is not found in the reflection coefficient and identifying a degradation risk associated with the electrical connection if the statistical deviation is found in the reflection coefficient; and using the assessed integrity to maintain the electrical connection.

2. The computer-implemented method of claim 1, wherein the monitoring of the reflection coefficient takes place under control of a background process during an idle state of the computer system.

3. The computer-implemented method of claim 1, wherein the sequential-analysis technique corresponds to a sequential probability ratio test.

4. The computer-implemented method of claim 1, wherein monitoring the reflection coefficient involves:
    periodically measuring the reflection coefficient from the electrical connection using time domain reflectometry (TDR); and
    digitizing the reflection coefficient.

5. The computer-implemented method of claim 4, wherein the sequential-analysis technique determines the statistical deviation of the reflection coefficient by comparing the reflection coefficient with previous reflection coefficients measured from the electrical connection.

6. The computer-implemented method of claim 1, wherein the sequential-analysis technique is applied to the reflection coefficient using a service processor in the computer system.

7. The computer-implemented method of claim 1, wherein using the assessed integrity to maintain the electrical connection involves at least one of:
    performing advanced reliability testing on the electrical connection; and
    correcting a fault in the electrical connection corresponding to a source of the statistical deviation.

8. A system for analyzing an electrical connection in a computer system, comprising:
    a time domain reflectometry (TDR) circuit configured to monitor a reflection coefficient associated with the electrical connection; and
    a sequential-analysis circuit configured to:
        apply a sequential-analysis technique to the reflection coefficient to determine a statistical deviation of the reflection coefficient;
        assess the integrity of the electrical connection based on the statistical deviation of the reflection coefficient by verifying the integrity of the electrical connection if the statistical deviation is not found in the reflection coefficient and identifying a degradation risk associated with the electrical connection if the statistical deviation is found in the reflection coefficient; and
        use the assessed integrity to maintain the electrical connection.

9. The system of claim 8, wherein the TDR circuit is configured to monitor the reflection coefficient under control of a background process during an idle state of the computer system.

10. The system of claim 8, wherein the sequential-analysis technique corresponds to a sequential probability ratio test.

11. The system of claim 8, wherein the TDR circuit is configured to monitor the reflection coefficient by:
    periodically measuring the reflection coefficient from the electrical connection using time domain reflectometry (TDR); and
    digitizing the reflection coefficient.

12. The system of claim 11, wherein the sequential-analysis technique determines the statistical deviation of the reflection coefficient by comparing the reflection coefficient with previous reflection coefficients measured from the electrical connection.

13. The system of claim 8, wherein the sequential-analysis circuit corresponds to a service processor in the computer system.

14. The system of claim 8, wherein the TDR circuit corresponds to a digital signal processor (DSP) in the computer system.

15. The system of claim 8, wherein using the assessed integrity to maintain the electrical connection involves at least one of:
    performing advanced reliability testing on the electrical connection; and
    correcting a fault in the electrical connection corresponding to a source of the statistical deviation.

16. A computer-readable storage medium storing instructions that when executed by a computer cause the computer to perform a method for analyzing an electrical connection in a computer system, the method comprising:
    monitoring a reflection coefficient associated with the electrical connection;
    applying a sequential-analysis technique to the reflection coefficient to determine a statistical deviation of the reflection coefficient;
    assessing the integrity of the electrical connection based on the statistical deviation of the reflection coefficient by verifying the integrity of the electrical connection if the statistical deviation is not found and identifying a degradation risk associated with the electrical connection if the statistical deviation is found; and
    using the assessed integrity to maintain the electrical connection.

17. The computer-readable storage medium of claim 16, wherein the monitoring of the reflection coefficient takes place under control of a background process during an idle state of the computer system.

* * * * *